US006989219B2

(12) United States Patent　　(10) Patent No.: US 6,989,219 B2
Magg　　(45) Date of Patent: Jan. 24, 2006

(54) HARDMASK/BARRIER LAYER FOR DRY ETCHING CHROME FILMS AND IMPROVING POST DEVELOP RESIST PROFILES ON PHOTOMASKS

(75) Inventor: Christopher K. Magg, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 10/871,941

(22) Filed: Jun. 17, 2004

(65) Prior Publication Data

US 2004/0241559 A1　Dec. 2, 2004

Related U.S. Application Data

(63) Continuation of application No. 09/683,929, filed on Mar. 4, 2002, now Pat. No. 6,811,959.

(51) Int. Cl.
　　*G03F 9/00*　　(2006.01)
(52) U.S. Cl. .......................................... 430/5
(58) Field of Classification Search ............ 430/5, 430/321; 216/12, 47, 51
See application file for complete search history.

(56) References Cited

U.S. PATENT DOCUMENTS

| 4,722,878 | A | 2/1988 | Watakabe et al. |
|---|---|---|---|
| 4,738,907 | A | 4/1988 | Shigetomi et al. |
| 4,873,163 | A | 10/1989 | Watakabe et al. |
| 4,876,164 | A | 10/1989 | Watakabe et al. |
| 4,985,319 | A | 1/1991 | Watakabe et al. |
| 5,126,231 | A | 6/1992 | Levy |
| 5,489,489 | A | 2/1996 | Swirbel et al. |
| 5,948,570 | A | 9/1999 | Kornblit et al. |
| 6,472,107 | B1 * | 10/2002 | Chan ........................ 430/5 |
| 6,580,172 | B2 * | 6/2003 | Mancini et al. ........... 257/762 |

FOREIGN PATENT DOCUMENTS

| JP | 56130750 A | 10/1981 |
|---|---|---|
| JP | 86048705 | 10/1986 |
| JP | 61255347 A | 11/1986 |
| JP | 4371954 A | 12/1992 |

OTHER PUBLICATIONS

IBM Technical Disclosure Bulletin; NN79054788; "Multi-density Mask"; May 1979.

* cited by examiner

Primary Examiner—S. Rosasco
(74) Attorney, Agent, or Firm—DeLio & Peterson, LLC; Kelly M. Nowak; Richard M. Kotulak

(57) ABSTRACT

A process for manufacturing and a photomask including a chrome layer over a transparent substrate, followed by a thin hardmask/barrier layer directly over the chrome layer having a thin resist layer thereover. The thin resist layer is patterned and developed wherein the barrier layer acts to retard the formation of a resist "foot" at the bottom of the resist profile. Exposed portions of the hardmask/barrier layer and the underlying chrome layer are etched, and then any remaining hardmask/barrier layer and resist layer is subsequently removed by an etchant. The hardmask/barrier layer directly over the chrome layer enables an improved pattern transfer mask during chrome etching processes, allows for further reduction in the thickness of the resist layer, improves the image quality, the achievable minimum resolution features, and provides nominal image size control and image size uniformity across the photomask within current process flows and manufacturing.

17 Claims, 6 Drawing Sheets

HARDMASK/BARRIER LAYER FOR DRY ETCHING CHROME FILMS AND IMPROVING POST DEVELOP RESIST PROFILES ON PHOTOMASKS

This is a continuation of application Ser. No. 09/683,929, filed on Mar. 4, 2002 now U.S. Pat. No. 6,811,959.

BACKGROUND OF THE INVENTION

1. Field of the Invention

This invention relates to a method and apparatus for improving resolution features printed on an optical mask for semiconductor fabrication, and in particular, to a method and apparatus for using a hardmask/barrier layer directly between a chrome layer and a resist layer for etching chrome films on optical masks and to improve image size uniformity and reduce errors in the nominal image size on optical masks.

2. Description of Related Art

In the manufacture of circuit patterns on electronic components, such as the manufacture of integrated circuits on semiconductor substrates, photomasks are used to transfer the desired circuit pattern onto the substrate workpiece. A photomask is typically employed a large number of times for the production of numerous electronic devices. This places stringent demands on the quality of a photomask since any flaws or defects in the photomask are reproduced in the workpiece, which directly affects the operability of the resultant workpiece.

A conventional photomask comprises a patterned metal film, such as chrome, deposited onto the surface of a transparent base and coating the metal film with a photoresist. A desired pattern is exposed and developed on the photoresist, and then portions of the underlying metal film are removed from the developed areas. Any remaining photoresist is subsequently removed leaving a patterned metal film on the substrate workpiece.

In typical processes of manufacturing a photomask on a chrome film, a wet etch process may be used in which ammonium cerium (IV) nitrate and perchloric acid are employed. However, the use of a wet etch process in the manufacture of a chrome mask makes it difficult to manufacture the mask with high accuracy as a result of the wet etching processes causing side etching effects/biases. Dry etch processes are also employed for the formation of photomasks on chrome films. A typical dry etch process of chrome masking employs the use of a mixed gas of carbon tetrachloride ($CCL_4$) and oxygen ($O_2$). The dry etch processes were found to be advantageous for manufacturing a mask with high accuracy, however, the etch rate of chrome using conventional dry etch processes is low. Furthermore, in conventional dry etch processes, the selection ratio of chrome to resist is poor, i.e., during the dry etch of the resist film, the underlying chrome layer etches faster than the photoresist thereby causing defects in such chrome layer.

Accordingly, such conventional dry etch processes typically cause several defects in the pattern for the photomask, such as opaque defects, clear defects, and poor resolution features, which in turn are transferred to the workpiece rendering it inoperable. Not only does the poor dry etch selectivity between the resist and chrome lead to defects on the mask, it also limits the minimum resolution that is achievable on the photomask as a result of the resist thickness needing to be increased, and thereby lowering the resolution, to compensate for the poor selectivity. Also, the poor etch selectivity between the resist and chrome films can lead to degraded critical dimension uniformity across the mask, particularly as the limits of usable resist thicknesses are approached.

A prior art solution to the poor etch selectivity between the resist and chrome films is to replace the chrome film with a silicide layer over the transparent substrate for a dry etch process. The silicide layer is formed over the transparent substrate to provide good joining ability between the mask material of silicide and the substrate, however, the use of a silicide masking material introduces several problems. For instance, suicides are more sensitive to the cleaning processes used during mask fabrication and may be degraded, i.e., removed and/or damaged, by such cleaning processes. Also, during the writing process charging distortions may be created due to the lower conductivity of the silicide film. Additionally, suicides cause defects in the sputter process as a combination of sputter targets, not a single sputter target, are used to form the silicide layer.

Another typical prior art solution to the poor resolution features, as a result of the poor etch selectivity between the resist and chrome films, has been addressed by modifying the resists to improve their etch resistance and selectivity to the underlying chrome film during dry etch processes. For example, a prior art technique to improve resolution features on the resultant mask is to reduce the thickness of the photoresist film deposited thereover the chrome film. In so doing, the dry etch time of the photoresist film is decreased causing premature thinning of the resist layer, thereby increasing the extent to which the underlying chrome layer is also etched and increasing the defects in the chrome layer. The thinning of the resist film may also lead to the resist film being completely removed during the chrome etch before the patterned images are fully transferred into the chrome layer. Other techniques of modifying the resists to improve their etch resistance and selectivity to the underlying chrome film during dry etch processes has been to modify the resist chemistry. However, it has been found that increasing etch resistance of the material can also degrade important resist performance parameters, such as, sensitivity, image quality and stability of the resist.

Still other prior art solutions include providing multiple layers over a transparent substrate in addition to the metal and resist layers for the formation of a photomask. However, such processes are both time consuming and expensive as they require additional processing steps.

Another issue that the industry faces as it begins the transition to the use of chemically amplified resists is the formation of a "foot" at the interface between the resist and a CrOxNy surface. This "foot" at the bottom of the post develop resist profile causes errors in both the nominal mask image size as well as the image size uniformity across the mask. In some cases the "foot" can also cause defects in the photomask pattern. It is believed that the formation of this "foot" is due to the presence of nitrogen in the Cr film and that this nitrogen poisons that resist at the Cr/resist interface leading to the poor image profiles in the resist after develop.

Attempts have been made in the art to find solutions that would eliminate the formation of the resist "foot." Attempted solutions have included, for example, surface treatments with $O_2$ plasma, isopropyl alcohol ("IPA"), hexamethyl-disilizane ("HMDS") or acid/base chemistries all prior to applying the resist. However, it has been found that none of such prior art solutions have been successful in elimination of the resist "foot."

Accordingly, a need continues to exist in the art to provide an improved method and photomask material that allows for the achievement of the desired nominal image size and image size uniformity on the photomask while remaining efficient, easy and relatively inexpensive to make the requiring minimal changes to the existing materials.

According, a need continues to exist in the to provide an improved method and photomask material which allows for the achievement of a desired minimal resolution on a photomask and which eliminates the resist "foot" at the interface between the resist film and the CrOxNy surface.

Bearing in mind the problems and deficiencies of the prior art, it is therefore an object of the present invention to provide an improved photomask material for manufacturing a photomask and an improved method for manufacturing such photomask which achieves a desired minimal resolution on a photomask.

Another object of the present invention is to provide an improved photomask material for manufacturing a photomask and an improved method for manufacturing such photomask that eliminates the resist "foot" at the interface between the resist film and the CrOxNy surface.

It is another object of the present invention to provide a photomask material and method of making such mask that is not subject to the limitations of imaging conventional chrome blocking layers.

A further object of the invention is to provide a simplified photomask material and method of making such mask that is less sensitive to mask defects.

Another object of the invention is to provide a photomask material and method of making such mask that is relatively easy and inexpensive to manufacture using existing tools and processes.

It is yet another object of the present invention to provide a photomask material and method of making such mask that will lead to improved critical dimension uniformity of the photomask.

Yet another object of the present invention is to provide a photomask material and method of making such mask that will lead to improved control of the nominal image size.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to a photomask material which includes an opaque layer directly over and contacting a mask blank in the form of a transparent substrate and a hardmask/barrier layer directly over and contacting the opaque layer.

In accordance with the invention, preferably, the transparent substrate comprises quartz, glass, silica glass, polysilicate glass, soda glass, or a thin membrane material made of silicon, SiN, SiC or diamond. The opaque layer has a thickness ranging from about 700 Å to about 1200 Å, and preferably comprises a chrome-based material including chrome or Cr:O:N.

In a first aspect, the hardmask/barrier layer preferably comprises a material including tungsten or tungsten-silicon having a thickness ranging from about 100 Å to about 600 Å. In accordance with the invention, wherein the hardmask/barrier layer, having a thickness ranging from about 100 Å to about 600 Å, is directly over the opaque layer, a resist layer is provided over the tungsten-based layer, preferably to a thickness ranging from about 1000 Å to about 2000 Å.

In a second aspect, the hardmask/barrier layer preferably comprises a material including tungsten, tungsten-silicon, tantalum, tantalum-silicon, or copper directly over and contacting the opaque layer and having a thickness ranging from about 20 Å to about 100 Å. In accordance with the second aspect of the invention, wherein the hardmask/barrier layer, having a thickness ranging from about 20 Å to about 100 Å, is directly over the opaque layer, a resist layer is provided over the tungsten-based layer, preferably to a thickness ranging from about 1000 Å to about 6000 Å.

In another aspect, the invention is directed to a photomask material which includes a chrome-based layer directly over and contacting a transparent glass substrate and a metal layer comprising tungsten, tungsten-silicon, tantalum, tantalum-silicon or copper directly over and contacting the chrome-based layer. A resist layer is provided over the metal layer. Preferably, the chrome-based layer comprises a material including chrome or Cr:O:N. Wherein the metal layer comprises tungsten or tungsten-silicon, it is deposited to a thickness ranging from about 100 Å to about 600 Å followed by a resist layer having a thickness ranging from about 1000 Å to about 2000 Å. Wherein the metal layer comprises tungsten, tungsten-silicon, tantalum, tantalum-silicon, or copper, it is deposited to a thickness ranging from about 20 Å to about 100 Å followed by a resist layer having a thickness ranging from about 1000 Å to about 6000 Å.

In yet another aspect, the present invention describes a method of manufacturing a photomask using the photomask materials as described above. In so doing, the method of manufacturing the photomask includes providing a transparent substrate, depositing an opaque layer directly over and contacting the transparent substrate, depositing a metal layer including tungsten, tungsten-silicon, tantalum, tantalum-silicon, or copper directly over and contacting the opaque layer, and coating a resist layer over the metal layer. The resist layer is then imaged to form a resist mask pattern which exposes portions of the metal layer. The exposed portions of the metal layer are etched using a first etchant that etches the metal layer faster than the underlying opaque layer to create a metal layer image. The metal layer image is then transferred into the underlying exposed portions of the opaque layer using a second etchant that etches the opaque layer faster than the metal layer to form a photomask in the opaque layer. The method may further include after transferring the hard mask image into the underlying opaque layer, removing any remaining metal layer.

The opaque layer may include chrome or Cr:O:N deposited to a thickness ranging from about 700 Å to about 1200 Å. Wherein the metal layer comprises tungsten or tungsten-silicon, it is deposited to a thickness ranging from about 100 Å to about 600 Å followed by a resist layer having a thickness ranging from about 1000 Å to about 2000 Å. Wherein the metal layer comprises tungsten, tungsten-silicon, tantalum, tantalum-silicon, or copper, it is deposited to a thickness ranging from about 20 Å to about 100 Å followed by a resist layer having a thickness ranging from about 1000 Å to about 6000 Å.

In the instant method, the step of forming the metal layer image includes etching the metal layer using an etchant which is highly selective to the metal layer whereby the etchant removes only the metal layer and leaves the underlying opaque layer intact.

Preferably, the photomask formed in the opaque layer in accordance with the method of the instant invention forms lithographic photomasks including optical photomasks, EUV photomasks, X-ray photomasks, SCAPLEL photomasks and photomasks in technologies using a chrome film as a pattern blocking layer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT

Figure 1A:
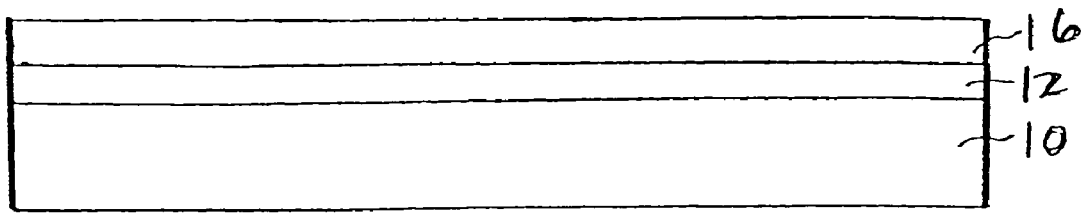
FIGS. 1A–1C are cross-sectional views showing conventional process steps and a conventional photomask material for manufacturing a photomask.

In describing the preferred embodiment of the present invention, reference will be made herein to FIGS. 1A–11 of the drawings in which like numerals refer to like features of the invention. Features of the invention are not necessarily shown to scale in the drawings.

The present invention relates to an additional metal hardmask/barrier layer between a resist layer and a chrome layer to act as a hardmask pattern transfer mask during the chrome dry etch processing and to act as a barrier between the resist layer and the chrome layer to eliminate the chemical poisoning of the resist from the nitrogen rich chrome surface.

In particular, a very thin hardmask/barrier layer comprising tungsten, tungsten-silicon, tantalum, tantalum-silicon, or copper layer is provided directly between a resist film and a chrome film to act as a hard mask layer during the dry etch pattern transfer process of forming an optical mask, as a barrier layer during the patterning of a photomask, or as a combination thereof.

Figure 1B:
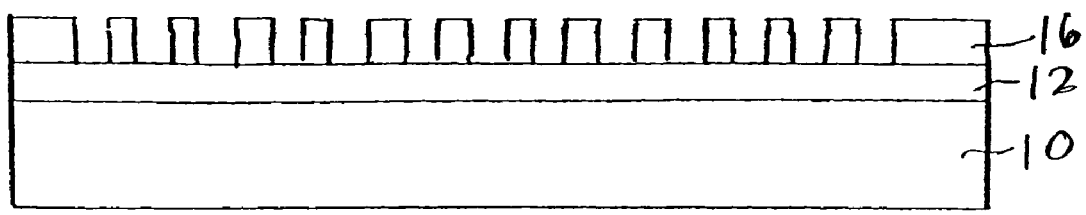
Figure 1C:
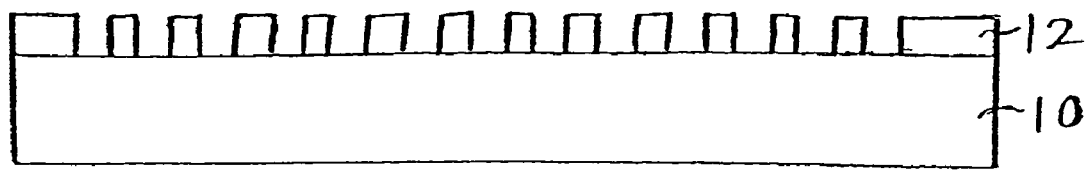
Figure 1D:
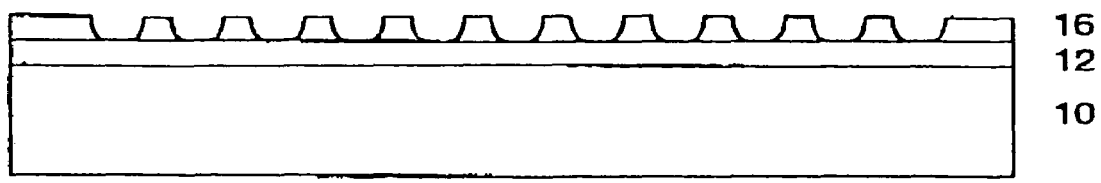
FIGS. 1D–E are cross-sectional views showing conventional process steps and a conventional photomask material for manufacturing a photomask wherein a post develop resist "foot" results at the interface between the resist and the opaque chrome layer that is then transferred into the opaque layer.
Figure 1E:
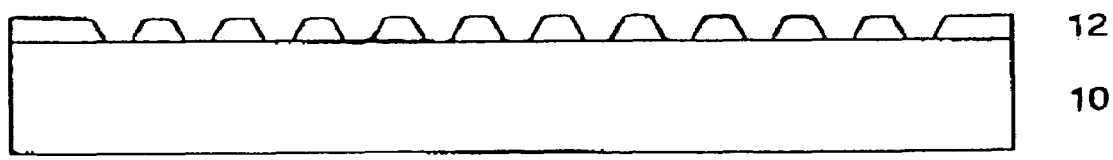

Referring to the drawings, FIGS. 1A–C show a conventional prior art chrome photomask process and the resultant mask. As illustrated in FIG. 1A, a silica glass substrate 10 is provided with a chrome film 12 deposited thereon to a thickness ranging from about 700 Å to about 1200 Å. A resist film 16 is then deposited directly thereover the chrome film 12 to a thickness ranging from about 4000 Å to about 6000 Å. For optical mask fabrication, the resist film is used as both the imaging layer and the masking layer for pattern transfer into the chrome film as shown in FIGS. 1B and 1C. However, it has been recognized that the thickness of the resist film directly correlates with the minimum achievable resolution on an optical mask and therefore the poor etch selectivity between the resist and chrome films places limits on the dimensions of the resist film, which in turn limits the minimum resolution that can be achieved on an optical mask. That is, the poor etch selectivity between the resist film and the chrome film places limits on how thin the resist film can be, thereby limiting the resolution of the resultant mask. Additionally, FIGS. 1D–E illustrate that for optical mask fabrication, the use of chemically amplified resists directly deposited upon the opaque chrome layer has been found to lead to a poor image profile at the interface between the resist and the chrome layers. This image profile which exists in the resist after it is developed, as illustrated in FIG. 1D, is then transferred into the chrome layer, as illustrated in FIG. 1E. It has been recognized that transferring of the poor resist profile places limits on the minimum achievable resolution and causes errors in both the nominal image size and image size uniformity across the resultant mask.

A typical prior art solution to the poor resolution features, as a result of the poor etch selectivity between the resist and chrome films, has been addressed by modifying the resists to improve their etch resistance and selectivity to the underlying chrome film during dry etch processes. One prior art technique to improve resolution features on the mask has been to use a thinner resist imaging layer, such as those resist layers having thicknesses ranging from about 3000 Å to about 4000 Å. However, due to the poor dry etch selectivity between the resist and the underlying chrome film, additional thinning of the resist layer is not practical within current process flow and manufacturing wherein the resist acts as both the imaging layer and the mask during the pattern transfer. It has been found that modifications of the resist films to improve etch resistance typically result in the degradation of important resist performance parameters, such as, resolution, sensitivity, image reliability, image quality, resist stability and the like.

Additionally, in the art of photomask development, it has been recognized that quartz substrates impose limitations when used in combination with conventional materials used for hardmasks, such as, SiN, $SiO_2$, and SiON. For instance, the use of SiN, SiO$_2$, and SiON hardmasks over a quartz substrate impose limitations on the etchant chemistry that can be used to remove the SiN, SiO$_2$, or SiON hardmask from the surface of the quartz substrate as certain etchants, such as, HF may etch and create defects in the quartz substrate during removal of such hardmasks. Such conventional hardmask films are also insulators which may lead to charging effects during the electron beam patterning process which, in turn, leads to poor image placement performance.

The present invention provides an improved solution to improving the minimum resolution features that can be achieved on a photomask as well as improving the post develop resist profile that can be achieved on a photomask within current process flows and manufacturing. The instant invention overcomes such problems by advantageously providing the use of a tungsten, tungsten-silicon, tantalum, tantalum-silicon or copper layer as a hardmask/barrier layer directly over a chrome layer which enables an improved pattern transfer mask during chrome etching processing and improved resist profile after development for advanced photomasks. The instant hardmask/barrier layer provides an improved pattern transfer mask during chrome etching as it is easily dry etched with a fluorine-based etchant, rather than chlorine/oxygen based etchants used for etching chrome layers, and it is easily removed through exposure to hydrogen peroxide solutions. The instant hardmask/barrier layer also prevents the nitrogen rich chrome surface from coming into direct contact with the resist layer, thereby eliminating the source of the resist poisoning and improving the image profile in the resist layer. Tungsten, tungsten-silicon, tantalum, tantalum-silicon or copper materials are preferred as they have been found to have no adverse interaction with the resist layer and they are easily removed from the mask without damaging either the remaining chrome or the quartz substrate, unlike other hardmask materials, such as SiO$_2$, SiON and SiN, which may damage the chrome and/or quartz substrate when removed. Additionally, tungsten, tungsten-silicon, tantalum, tantalum-silicon or copper materials are preferred as they are conducting materials so that charging induced distortions are not present during electron beam exposure as would be the case with SiO$_2$, SiN and SIGN insulating films.

In accordance with the invention, it has unexpectedly been found that the use of a thin tungsten or tungsten-silicon hardmask layer therebetween the resist and chrome films allows for further reduction in the thickness of the resist layer, thereby allowing for the continued use of the current resist systems, and resulting in improved resolution, image quality, critical dimension uniformity, and the like. Additionally, it has unexpectedly been found that the use of a thin tungsten, tungsten-silicon, tantalum, tantalum-silicon, or copper barrier layer between the resist and the chrome films allows for the elimination of the resist "foot", also resulting in improved resolution, image quality, critical dimension uniformity and the like. The primary application of the instant invention is for optical masks, but the same process may also be used on masks for other advanced lithographies, such as, EUV, X-ray, SCAPLEL, and any technology that uses a chrome film as the pattern blocking layer.

The following description is an application of the present invention in a dry etching process of an opaque layer, preferably a chrome film, for formation of an optical mask. While the preferred embodiment of the present invention is described in terms of the dry etch process of a chrome film to form an optical mask, it will be understood and appreciated by those skilled in the art that the present invention includes etching processes of other films for formation of a variety of masks, and is generally applicable to the manufacturing processes of electronic devices and structures.

Preferred embodiments of the invention are illustrated in FIGS. 2–9 and 11. FIGS. 2–9 and 11 illustrate the steps of forming the instant photomask using a continuous, thin tungsten, tungsten-silicon, tantalum, tantalum-silicon or copper barrier layer. Preferably, the tungsten-silicon and tantalum-silicon layers comprise a tungsten$_x$:silicon$_y$, or tantalum :silicon$_y$ layer where x=50 to 100 and y=0 to 50.

Figure 2:
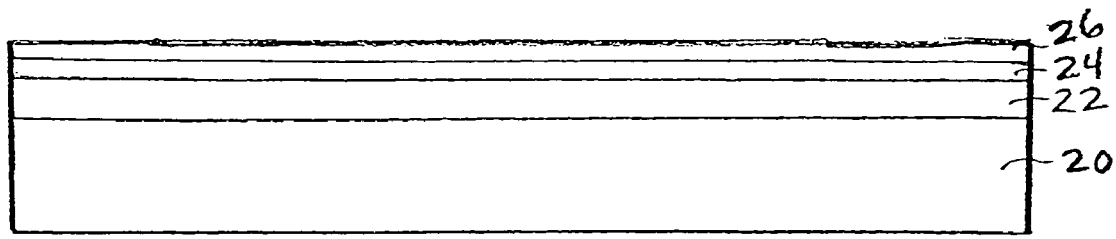
FIG. 2 illustrates the photomask material including a chrome film having a thin metal hardmask layer directly thereover followed by a thin resist layer for manufacturing a photomask according to the present invention.

FIG. 2 depicts a substrate 20 which may comprise a transparent substrate made from a material including quartz, glass, silica glass, polysilicate glass, soda glass, thin membrane materials made of silicon, SiN, SiC and diamond, and the like. An opaque first layer 22, preferably comprising a metal layer, is deposited over the substrate 20 to a thickness ranging from about 700 Å to about 1200 Å. The first layer 22 may comprise a chrome-based layer including a chrome layer or a Cr:O:N layer. In the preferred embodiment, the first layer 22 comprises a conformal chrome layer 22 deposited over a quartz substrate 20 to a thickness ranging from about 700 Å to about 1200 Å. The chrome layer 22 may be conformally deposited onto the quartz substrate 20 by known techniques, such as, evaporation, sputtering, and the like.

In accordance with a first aspect of the invention, following deposition of the opaque first layer 22 over the substrate 20, a second metal layer may be deposited directly thereover the first layer 22. The second metal layer comprises a hardmask layer 24 deposited over so as to directly contact the first layer 22 as shown in FIG. 2. The hardmask layer 24 comprises a material which is selectively chosen such that the hardmask material does not chemically interact with or add additional defects to the underlying first layer 22. The hardmask layer 24 of the invention is chosen from a material which has the additional properties of being easily deposited onto the first layer 22, having strong adhesion thereto, as well as being easily removed from the surface of the underlying first layer 22 without damaging or altering either the first layer 22 or the substrate 20. In accordance with the invention, an important property or feature of the material of hardmask layer 24 is that such material is selectively chosen from a material that etches at a slower rate than the underlying first layer, i.e., the underlying chrome layer 22. Preferably, the hardmask material is selectively chosen from a material so that during an etching step of the first layer 22, the first layer 22 etches two to four times faster than the material of hardmask layer 24 thereby allowing for the use of a thin hardmask layer 24 and resist layer 26, both as described further below, which leads to improved resolution, critical dimension uniformity and reduced defects in the photomask.

Preferably, following deposition of the chrome layer 22 over the quartz substrate 20 preferably a thin tungsten-based hardmask layer, as described above, is conformally deposited directly over the chrome layer 22 so as to contact the chrome layer. As the substrate preferably comprises a quartz substrate 20, tungsten or tungsten-silicon is preferably chosen as the hardmask material as it is easily dry etched with a fluorine-based etchant, and it is easily removed through exposure to hydrogen peroxide solutions. The thin, conformal tungsten or tungsten-silicon hardmask layer 24 is deposited by known techniques including DC magnetron sputter, DC bipolar sputter, AC sputter, and evaporation to create a uniform, thin tungsten-based hardmask layer 24 having the above described properties. Preferably, the thin tungsten or tungsten-silicon hardmask layer 24 is deposited directly over the chrome layer 22 to a thickness ranging from about 100

Å to about 600 Å, more preferably from about 200 Å to about 300 Å. The thin tungsten-based hardmask layer 24 of the invention acts as a barrier protecting the underlying chrome layer 22 from chemicals used during etching of an overlying resist imaging layer. As the hardmask layer 24 is deposited thinly to a thickness of about 100 Å to about 600 Å, an adhesion promoting layer is not required at the interface of the chrome layer 22 and the tungsten-based hardmask layer 24.

After deposition of the tungsten-based hardmask layer 24, a resist layer 26 may be deposited over the hardmask layer. The resist layer 26 may be deposited by known techniques including, for example, spin coating, and the like. Resist layer 26 may comprise a positive or a negative resist layer. In the preferred embodiment, resist layer 26 is deposited directly thereover the tungsten-based hardmask layer 24 so as to contact the tungsten-based hardmask layer 24 as shown in FIG. 2. Optionally, in another embodiment of the invention, an adhesion promoting film, such as, Hexa-methyl-disilizane ("HMDS") may be used between the thin tungsten-based hardmask layer 24 and the resist layer 26 to promote adhesion therebetween.

In accordance with the invention, as a result of the thin tungsten-based hardmask layer 24 being directly over the chrome layer 22, the resist layer 26 may be deposited thinly, to a thickness ranging from about 1000 Å to about 2000 Å. It has unexpectedly been found that the use of a thin tungsten hardmask layer or tungsten-silicon hardmask layer 24 provides the unexpected advantage of allowing the resist layer to be deposited to a thickness which is smaller in dimensions than conventional prior art resist layers deposited over chrome layers. In accordance with the invention, it has also been found that the advantage of being able to deposit a thin resist layer, i.e., ranging from about 1000 Å to about 2000 Å, provides for improved achievable minimum resolution on the optical mask.

Figure 3:
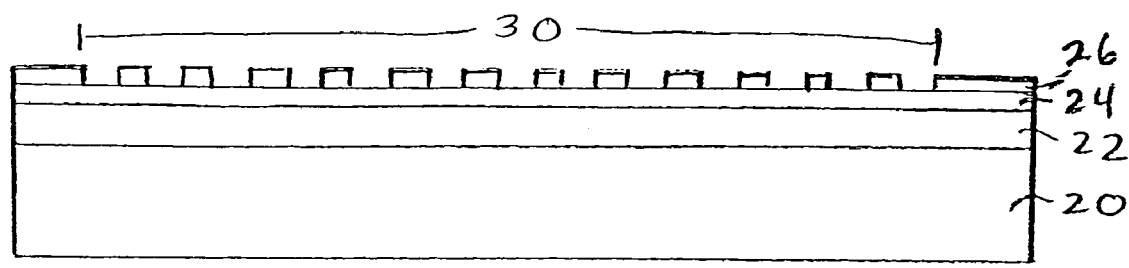
FIG. 3 illustrates the step of forming a resist mask pattern in the resist layer of the photomask material of FIG. 2.

FIG. 3 illustrates, after deposition of the resist layer 26, the resist layer may be patterned by imaging the resist by exposure to either light or electron beam and then developing the resist layer, followed by baking, to form a resist mask pattern 30 in the resist layer 26. As shown in FIG. 3, the resist mask pattern 30 exposes underlying portions of the thin tungsten-based hardmask layer 24.

Figure 4:
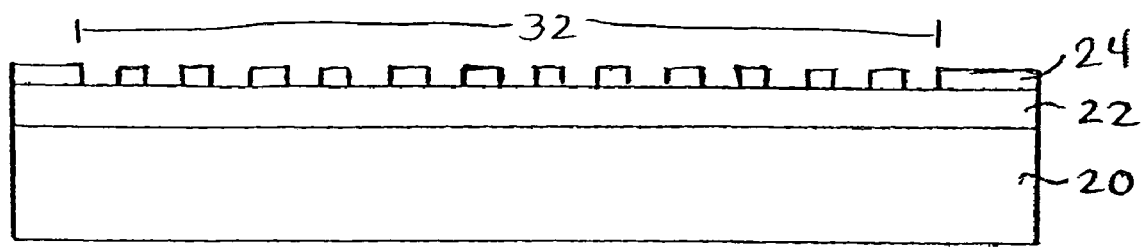
FIG. 4 illustrates the step of transferring the resist mask pattern of FIG. 3 into the underlying thin metal hardmask layer using an etchant that etches the thin metal hardmask layer selective to the chrome layer for manufacturing a photomask according to the present invention.

Subsequently, FIG. 4 illustrates that the resist mask pattern 30 is transferred into the thin tungsten-based hardmask layer 24 by etching the underlying tungsten-based film to create a hard mask image 32 therein the tungsten or tungsten-silicon layer. In accordance with the invention, the thin tungsten-based hardmask layer 24 is etched using an etchant which is highly selective to the tungsten or tungsten-silicon layer thereby etching the tungsten or tungsten-silicon layer at a faster rate than the underlying chrome layer 22. Preferably, the etchant is a fluorine-based etchant such as, for example, $CF_4$.

In so doing, as shown in FIG. 4, the fluorine-based etchant removes the resist layer 26 from the surface of the thin tungsten-based hardmask layer 24 and etches the tungsten or tungsten-silicon layer to form a hard mask image 32 in the thin tungsten hardmask layer. As further shown in FIG. 4, the etching of the tungsten or tungsten-silicon layer for formation of the hard mask image 32 does not etch the underlying chrome layer thereby leaving such chrome layer intact. Any remaining resist layer 26 not removed during etching of the tungsten layer may then be removed in a separate dry or wet etch process, or as part of a subsequent chrome etch process.

Figure 5:
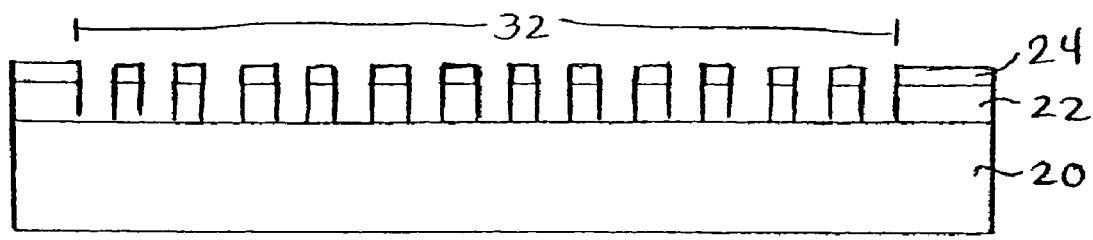
FIG. 5 illustrates the step of transferring the thin metal hardmask layer mask pattern of FIG. 4 into the underlying chrome layer using another etchant which etches the chrome layer selective to the thin metal hardmask layer.
Figure 6:
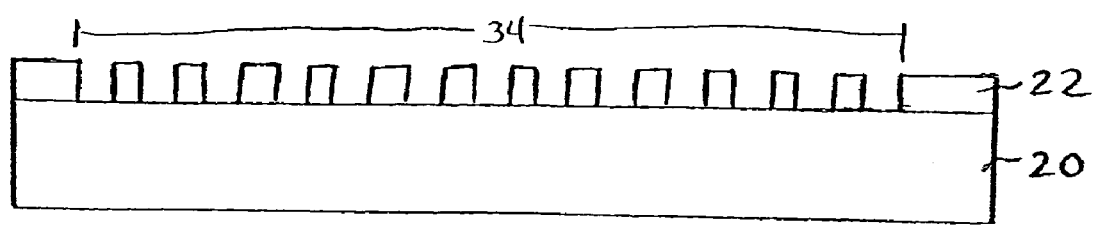
FIG. 6 illustrates the step of removing any remaining thin metal hardmask layer to provide the photomask of the present invention.

As shown in FIG. 5, the hard mask image 32 in the tungsten-based hardmask layer is then transferred into the chrome layer 22 using a second etchant which etches the chrome faster than the tungsten or tungsten-silicon layer. The second etchant may comprise an etchant which etches chrome selective to tungsten or tungsten-silicon such as a $Cl_2/O_2$, or other $Cl_2/O_2$ containing mixtures. Any remaining thin tungsten-based hardmask layer 24 is then entirely removed using a hydrogen peroxide containing solution as shown in FIG. 6 to provide an optical mask 34 in the chrome layer 22 which has improved resolution, image quality and critical dimension uniformity as a result of the thin tungsten hardmask layer 24 being provided directly therebetween the resist layer and the chrome layer.

The pattern contained in the photomask may then be reproduced onto a surface of a workpiece typically by placing the photomask over the workpiece and irritating a radiation-sensitive resist material on the workpiece. The variety of radiation sources include visible light, ultraviolet light, x-ray radiation, electrons, ions and EUV (Extreme Ultraviolet). When illuminated by the radiation, the metal pattern on the photomask serves to selectively block portions of the radiation beam while allowing other portions to be transmitted through the non-metallized areas. In this manner, complex geometries having very narrow line widths can be reproduced allowing the economical production of very large scale integrated circuits and other devices.

The first aspect of the present invention achieves the objects recited above. In accordance with the first aspect of the invention, the use of a thin tungsten or tungsten-silicon hardmask layer directly over a chrome layer over a quartz substrate 20 provides good etch selectivity with respect to the underlying chrome layer and quartz substrate to avoid etching and creating defects in the quartz substrate during etching of the chrome layer and removal of the tungsten hardmask layer. Advantageously, the use of the thin tungsten-based hardmask layer 24 also allows for deposition of a thin resist layer which improves the achievable minimum resolution, image quality and critical dimension uniformity of the resultant optical mask. The additional reduction in the resist film thickness is possible for two reasons. The advantage lies, firstly, in that the selectivity of the resist to the tungsten film is greater than that of the resist to chrome due to the use of a different dry etch process. Second, the tungsten film used as a hard mask is less than half the thickness of the chrome layer.

In a comparative study, as shown in the following table, the etch rates of the resist, tungsten and chrome layers were compared using a $CF_4$ based etchant versus a $Cl_2/O_2$ etchant.

TABLE

| Material | Etch Rate in $CF_4$ (nm/min.) | Etch Rate in $Cl_2/O_2$ (nm/min.) |
| --- | --- | --- |
| Resist | 22 | 17 |
| Tungsten | 6.1 | ~0 |
| Chrome | ~0 | 10.2 |

As shown in the above table, the chrome layer underlying the tungsten layer had a negligible etch rate in the $CF_4$ etchant as compared to the tungsten layer, while the resist etch rate was of a comparable etch magnitude in both the $CF_4$ and $Cl_2/O_2$ etchants. Moreover, in the $Cl_2/O_2$ etchant, the tungsten layer overlying the chrome layer had a negligible etch rate in comparison to the chrome layer. This indicates that the $CF_4$ etchant has excellent selectivity of the tungsten layer in comparison to the chrome layer, and would etch the tungsten layer at a faster rate than the chrome layer. Likewise, the $Cl_2/O_2$ etchant has excellent selectivity of the chrome layer in comparison to the tungsten layer, and would etch the chrome layer at a faster rate than the tungsten layer. This excellent selectivity of etchants between the tungsten and chrome layers advantageously allows for the use of a very thin layer of tungsten, i.e., about 100 Å to about 600 Å, to act as the hardmask in the instant invention.

Figure 7:
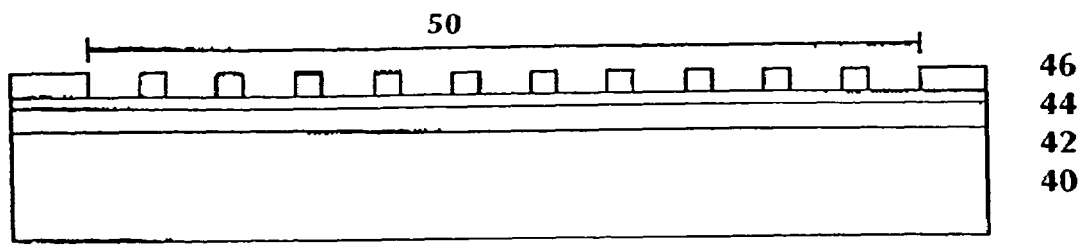
FIG. 7 illustrates a second aspect of the invention, wherein the photomask material includes a chrome film having a thin metal barrier layer directly thereover followed by a resist layer and the step of forming a resist mask pattern in the resist layer of the photomask.
Figure 8:
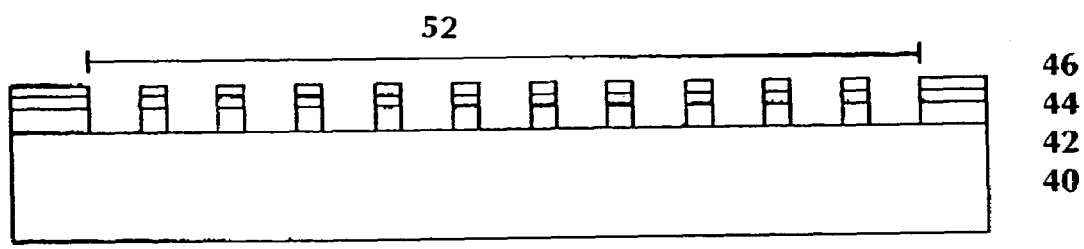
FIG. 8 illustrates the step of transferring the resist mask pattern of FIG. 7 into the underlying thin metal barrier layer and the opaque chrome layer.
Figure 9:
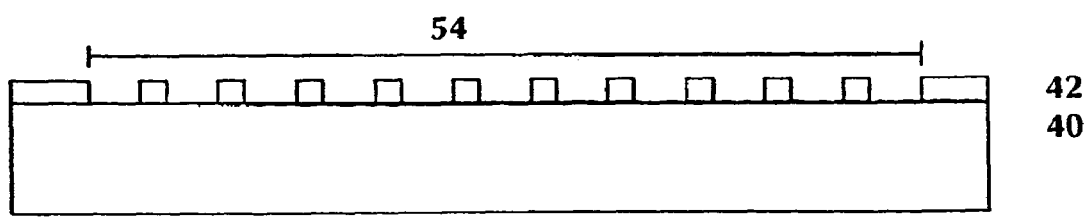
FIG. 9 illustrates the step of removing any remaining resist and/or thin metal barrier layer material to provide the photomask of the current invention.

In accordance with a second aspect of the invention, as shown in FIGS. 7–9, following deposition of an opaque first layer 42 over a substrate 40, a second metal layer may be deposited directly thereover the first layer 42. Like the illustration shown in FIG. 2, the substrate 40 may comprise a transparent substrate made from a material including quartz, glass, silica glass, polysilicate glass, soda glass, thin membranes made of silicon, SiN, SiC or diamond, and the like. The opaque first layer 42, preferably comprising a conformal chrome-based layer including a chrome layer or a Cr:O:N layer, is deposited over the substrate 40 to a thickness ranging from about 700 Å to about 1200 Å. The second metal layer comprises a barrier layer 44 deposited over so as to directly contact the first layer 42 as shown in FIG. 7. As in the first aspect of the invention, the barrier layer 44 comprises a material which is selectively chosen such that it does not chemically interact with or add additional defects to the underlying first layer 42 or the resist layer 46, as well as having the additional property of being easily deposited onto the first layer 42 without damaging either the first layer 42 or the substrate 40.

Preferably, following deposition of the chrome layer 42 over the substrate 40, preferably a thin tungsten, tungsten-silicon, tantalum, tantalum-silicon or copper based barrier layer, as described above is conformally deposited directly over the chrome layer 42 so as to contact the chrome layer. Tungsten, tungsten-silicon, tantalum, tantalum-silicon or copper is preferably chosen as the barrier layer material as it does not poison the resist layer 46 and it is easily removed through exposure to either hydrogen peroxide, or nitric acid solutions. The thin conformal tungsten, tungsten-silicon, tantalum, tantalum-silicon or copper barrier layer 44 is deposited by known techniques including DC magnetron sputter, DC bipolar sputter, AC sputter and evaporation to create a uniform, thin tungsten, tungsten-silicon, tantalum, tantalum-silicon or copper based layer 44 having the above described properties. Preferably, the thin tungsten, tungsten-silicon, tantalum, tantalum-silicon or copper barrier layer is deposited directly over the chrome layer 42 to a thickness ranging from about 20 Å to about 100 Å, more preferably from about 40 Å to about 70 Å. The thin tungsten, tungsten-silicon, tantalum, tantalum-silicon or copper barrier layer 44 of the invention acts to protect the resist layer 46 from adverse chemical interaction with the chrome layer 42. As the barrier layer 44 is deposited thinly to a thickness of about 20 Å to about 100 Å, an adhesion promoting layer is not required at the interface of the chrome layer 42 and the tungsten, tungsten-silicon, tantalum, tantalum-silicon or copper barrier layer 44.

After deposition of the tungsten, tungsten-silicon, tantalum, tantalum-silicon or copper based barrier layer 44, a resist layer 46 is deposited over the barrier layer. The resist layer may be deposited by known techniques including for example spin coating and the like. Resist layer 46 may comprise a positive or a negative resist layer. In the preferred embodiment, resist layer 46 is deposited directly thereover the tungsten, tungsten-silicon, tantalum, tantalum-silicon or copper based barrier layer 44 so as to contact the tungsten, tungsten-silicon, tantalum, tantalum-silicon or copper barrier layer 44 as shown in FIG. 7. Optionally, in another embodiment of this invention, an adhesion promoting film, such as hexa-methyl-disilizane (HMDS) may be used between the thin tungsten, tungsten-silicon, tantalum, tantalum-silicon or copper based barrier layer 44 and the resist layer 46 to promote adhesion therebetween.

In accordance with the invention, as a result of the thin tungsten, tungsten-silicon, tantalum, tantalum-silicon or copper based barrier layer 44, it has been found that the resist image profile is improved by eliminating the source of chemical contamination that takes place when the resist layer 46 and chrome layer 42 are in direct contact. This has the advantage of improving the minimum resolution achievable on the mask and also reduces the errors in the nominal image size and the image size uniformity across the mask.

FIG. 7 further illustrates, after deposition of the resist layer 46, the resist layer may be patterned by imaging the resist by exposure to either light or electron beam and then developing the resist layer, followed by baking to form a resist mask pattern 50 in the resist layer 46 that is vertical throughout the depth of resist film 46 and does not have a "foot" at the bottom of the resist profile. As shown in FIG. 7, the resist mask pattern 50 exposes underlying portions of the thin tungsten, tungsten-silicon, tantalum, tantalum-silicon or copper based barrier layer 44.

Subsequently, FIG. 8 illustrates that the resist mask pattern 50 is transferred into the thin tungsten, tungsten-silicon, tantalum, tantalum-silicon or copper based barrier layer 44 and into the opaque chrome layer 42 to form the patterned mask image 52 in the chrome layer 42. In accordance with the invention, the thin tungsten, tungsten-silicon, tantalum, tantalum-silicon or copper based barrier layer 44 and the opaque chrome layer 42 are etched in a single etch step that uses an etchant sequence that first etches the barrier layer 44 and then etches the chrome layer 42. In doing so, as shown in FIG. 8, the resist pattern 50 is transferred into the thin tungsten, tungsten-silicon, tantalum, tantalum-silicon or copper based barrier layer 44 and the chrome layer 42.

As shown in FIG. 9, the remaining barrier layer 44 and the resist layer 46 are entirely removed using either a hydrogen peroxide or nitric acid containing solution as appropriate for the material being removed. This provides an optical mask 54 in the chrome layer 42 which has improved resolution, image quality and image size uniformity as a result of the thin tungsten, tungsten-silicon, tantalum, tantalum-silicon or copper based barrier layer 44 being provided directly between the resist layer and the chrome layer.

The second aspect of the present invention achieves the objects recited above. In accordance with the invention, the use of thin tungsten, tungsten-silicon, tantalum, tantalum-silicon or copper based barrier layer directly over a chrome layer over a quartz substrate 40 provides for an isolation of the chrome layer from the resist layer thereby eliminating the adverse chemical interaction of the chrome layer with the resist layer. Advantageously, the use of a thin tungsten, tungsten-silicon, tantalum, tantalum-silicon or copper based barrier layer 44 leads to improved image quality, resolution and image size uniformity of the resultant optical mask.

Figure 10:
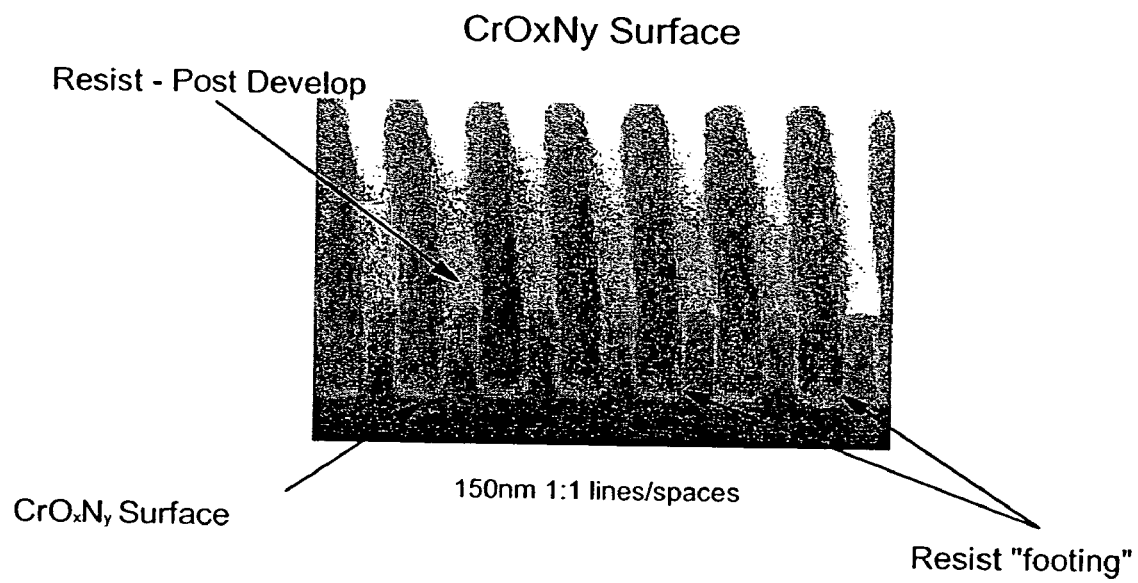
FIG. 10 is an SEM cross-section of 150 nm lines and spaces after a conventional resist develop wherein resist is in contact with the chrome layer and a "foot" is observed in the resist profile at the interface between the resist layer and the chrome layer.
Figure 11:
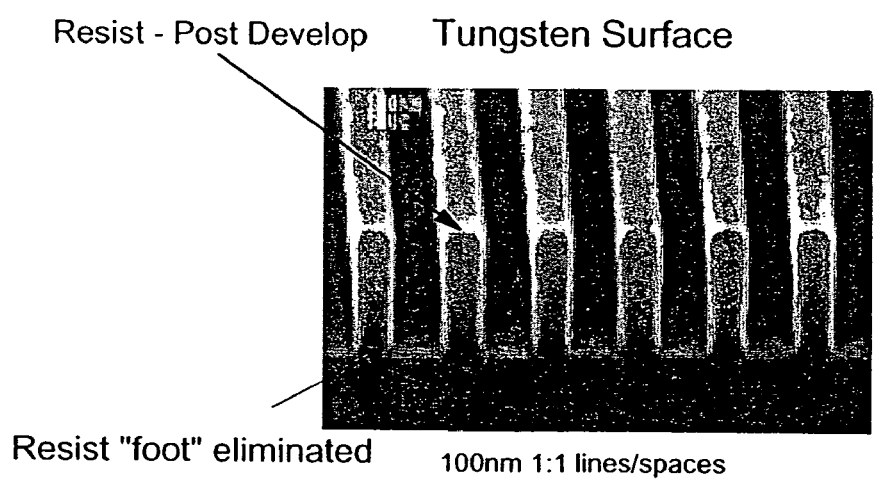
FIG. 11 is an SEM cross-section of 100 nm lines and spaces after resist develop in accordance with the instant invention wherein the resist is in contact with the metal barrier layer and the resist profile is vertical with no distortions at the interface between the resist and the instant metal barrier layer.

The resultant elimination of the resist "foot" is evident in a comparison of FIG. 10 and FIG. 12. In FIG. 10, in which the resist is in direct contact with the chrome layer, a "foot" at the bottom of the resist profile at the interface with the chrome layer is evident. However, from FIG. 11, in which a thin tungsten based barrier layer was placed between the chrome layer and the resist layer, it is evident that the resist profile is vertical throughout the depth of the resist layer and there is no evidence of a "foot" at the interface between the resist layer and the tungsten based barrier layer.

In still a further aspect of the present invention, a very thin hardmask/barrier layer combination may be provided directly between a resist film and a chrome film to act as both a hard mask layer during the dry etch pattern transfer process of forming an optical mask and as a barrier layer during the patterning of a photomask. In so doing, as will be understood in view of a combination of the above descriptions of the first and second aspects of the invention, the thin hardmask/barrier layer comprises a tungsten or tungsten-silicon material deposited directly over the chrome layer to a thickness of about 100 Å, followed by the resist layer as described above. Advantageously, the thin tungsten or tungsten-silicon hardmask/barrier layer both allows for deposition of a thin resist layer which improves the achievable minimum resolution, image quality and critical dimension uniformity of the resultant optical mask and eliminates the formation of a resist "foot" at the interface between the resist layer and the hardmask/barrier layer.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A photomask blank material comprising:
a mask blank in the form of a transparent substrate;
an opaque layer directly over and contacting the transparent substrate;
a metal layer directly over and contacting the opaque layer having a thickness ranging from about 20 Å to about 600 Å; and
a resist layer directly over and contacting the metal layer having a thickness ranging from about 1000 Å to about 2000 Å to provide for improved achievable minimum resolution on the photomask.

2. The photomask material of claim 1 wherein the transparent substrate is made of a material selected from the group consisting quartz, glass, silica glass, polysilicate glass, soda glass, and thin membrane materials made of silicon, SiN, SiC and diamond.

3. The photomask material of claim 2 wherein the opaque layer comprises a chrome-based material selected from the group consisting of chrome and Cr:O:N.

4. The photomask material of claim 3 wherein the metal layer comprises a material selected from the group consisting of tungsten, tungsten-silicon, tantalum, and tantalum-silicon.

5. The photomask material of claim 1 wherein the metal layer comprises a material selected from the group consisting of tungsten and tungsten-silicon, the metal layer having a thickness ranging from about 100 Å to about 600 Å.

6. A photomask blank material comprising:
a transparent glass substrate;
a chrome-based layer directly over and contacting the transparent glass substrate;
a metal layer comprising a material selected from the group consisting of tungsten, tungsten-silicon, tantalum, tantalum-silicon, and copper directly over and contacting the chrome-based layer, the metal layer having a thickness ranging from about 20 Å to about 600 Å; and
a resist layer directly over and contacting the metal layer, the resist layer having a thickness ranging from about 1000 Å to about 2000 Å to provide for improved achievable minimum resolution on the photomask.

7. The photomask material of claim 6 wherein the chrome-based layer comprises a material selected from the group consisting of chrome and Cr:O:N deposited to a thickness ranging from about 700 Å to about 1200 Å.

8. The photomask material of claim 7 wherein the metal layer comprises a material selected from the group consisting of tungsten, tungsten-silicon, tantalum, tantalum-silicon and copper, and is deposited to a thickness ranging from about 20 Å to about 100 Å.

9. The photomask material of claim 7 wherein the metal layer comprises a material selected from the group consisting of tungsten and tungsten-silicon deposited to a thickness ranging from about 100 Å to about 600 Å.

10. A photomask blank material comprising:
a mask blank in the form of a transparent substrate;
an opaque layer directly over and contacting the transparent substrate;
a metal layer directly over and contacting the opaque layer, the metal layer having a thickness ranging from about 20 Å to about 600 Å;
an adhesion promoting layer directly over and contacting the metal layer; and
a resist layer directly over and contacting the adhesion promoting layer, the resist layer having a thickness ranging from about 1000 Å to about 2000 Å to provide for improved achievable minimum resolution on the photomask.

11. The photomask material of claim 10 wherein the opaque layer comprises a chrome-based layer.

12. The photomask material of claim 11 wherein the transparent substrate is selected from the group consisting of quartz, glass, silica glass, polysilicate glass, soda glass, and thin membrane materials made of silicon, SiN, SiC and diamond.

13. The photomask material of claim 12 wherein the metal layer is selected from the group consisting of tungsten, tungsten-silicon, tantalum, tantalum-silicon and copper.

14. The photomask material of claim 10 wherein said opaque layer has a thickness ranging from about 700Å to about 1200 Å.

15. The photomask material of claim 10 wherein the adhesion promoting layer comprises Hexa-methyl-disilizane.

16. The photomask material of claim 10 wherein the metal layer comprises a material selected from the group consisting of tungsten, tungsten-silicon, tantalum, tantalum-silicon and copper, and is deposited to a thickness ranging from about 20 Å to about 100 Å.

17. The photomask material of claim 10 wherein the metal layer comprises a material selected from the group consisting of tungsten and tungsten-silicon deposited to a thickness ranging from about 100 Å to about 600 Å.

* * * * *